(12) United States Patent
Houng et al.

(10) Patent No.: US 7,616,139 B2
(45) Date of Patent: Nov. 10, 2009

(54) ANALOG-TO-DIGITAL CONVERSION (ADC) BASED ON CURRENT FLOW BETWEEN PAIRED PROBES AND ELECTRODES

(75) Inventors: Young-Tack Houng, Suwon-Si (KR); Sang-Wook Kwon, Seongnam-Si (KR); In-Sang Song, Seoul (KR); Seung Seob Lee, Daejeon (KR); Kangwon Lee, Daejeon (KR); Seok Woo Lee, Gongju-Si (KR); Phillip Lee, Seoul (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 12/048,546

(22) Filed: Mar. 14, 2008

(65) Prior Publication Data
US 2009/0096652 A1   Apr. 16, 2009

(30) Foreign Application Priority Data
Oct. 10, 2007  (KR) .................. 10-2007-0102012

(51) Int. Cl.
*H03M 1/00*    (2006.01)
(52) U.S. Cl. ................. 341/133; 341/155; 341/159
(58) Field of Classification Search ............. 341/133, 341/159, 160
See application file for complete search history.

(56) References Cited
U.S. PATENT DOCUMENTS
6,972,702 B1 * 12/2005 Moon ................. 341/133
* cited by examiner

*Primary Examiner*—Khai M Nguyen
(74) *Attorney, Agent, or Firm*—DLA Piper LLP US

(57) ABSTRACT

An analog-to-digital converter (ADC) is provided to determine a digital output value according to whether electric current flows between a plurality of probes, to which an input voltage is applied, and a plurality of electrodes. Therefore, high resolution and high speed operation is possible, but with lower power consumption.

27 Claims, 9 Drawing Sheets

FIG. 2

< 4-bit >

| Decimal number | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Thermometer code | 0 | 0 | 0 | 0 | 0 | 0 | 0 | 0 | 0 | 0 | 0 | 0 | 0 | 0 | 0 | 1 |
| | 0 | 0 | 0 | 0 | 0 | 0 | 0 | 0 | 0 | 0 | 0 | 0 | 0 | 0 | 1 | 1 |
| | 0 | 0 | 0 | 0 | 0 | 0 | 0 | 0 | 0 | 0 | 0 | 0 | 0 | 1 | 1 | 1 |
| | 0 | 0 | 0 | 0 | 0 | 0 | 0 | 0 | 0 | 0 | 0 | 0 | 1 | 1 | 1 | 1 |
| | 0 | 0 | 0 | 0 | 0 | 0 | 0 | 0 | 0 | 0 | 0 | 1 | 1 | 1 | 1 | 1 |
| | 0 | 0 | 0 | 0 | 0 | 0 | 0 | 0 | 0 | 0 | 1 | 1 | 1 | 1 | 1 | 1 |
| | 0 | 0 | 0 | 0 | 0 | 0 | 0 | 0 | 0 | 1 | 1 | 1 | 1 | 1 | 1 | 1 |
| | 0 | 0 | 0 | 0 | 0 | 0 | 0 | 0 | 1 | 1 | 1 | 1 | 1 | 1 | 1 | 1 |
| | 0 | 0 | 0 | 0 | 0 | 0 | 0 | 1 | 1 | 1 | 1 | 1 | 1 | 1 | 1 | 1 |
| | 0 | 0 | 0 | 0 | 0 | 0 | 1 | 1 | 1 | 1 | 1 | 1 | 1 | 1 | 1 | 1 |
| | 0 | 0 | 0 | 0 | 0 | 1 | 1 | 1 | 1 | 1 | 1 | 1 | 1 | 1 | 1 | 1 |
| | 0 | 0 | 0 | 0 | 1 | 1 | 1 | 1 | 1 | 1 | 1 | 1 | 1 | 1 | 1 | 1 |
| | 0 | 0 | 0 | 1 | 1 | 1 | 1 | 1 | 1 | 1 | 1 | 1 | 1 | 1 | 1 | 1 |
| | 0 | 0 | 1 | 1 | 1 | 1 | 1 | 1 | 1 | 1 | 1 | 1 | 1 | 1 | 1 | 1 |
| | 0 | 1 | 1 | 1 | 1 | 1 | 1 | 1 | 1 | 1 | 1 | 1 | 1 | 1 | 1 | 1 |
| Binary code (4-bit) | 0 | 0 | 0 | 0 | 0 | 0 | 0 | 0 | 1 | 1 | 1 | 1 | 1 | 1 | 1 | 1 |
| | 0 | 0 | 0 | 0 | 1 | 1 | 1 | 1 | 0 | 0 | 0 | 0 | 1 | 1 | 1 | 1 |
| | 0 | 0 | 1 | 1 | 0 | 0 | 1 | 1 | 0 | 0 | 1 | 1 | 0 | 0 | 1 | 1 |
| | 0 | 1 | 0 | 1 | 0 | 1 | 0 | 1 | 0 | 1 | 0 | 1 | 0 | 1 | 0 | 1 |

< 2-bit >

| Decimal number | 0 | 1 | 2 | 3 |
|---|---|---|---|---|
| Thermometer code | 0 | 0 | 0 | 1 |
|  | 0 | 0 | 1 | 1 |
|  | 0 | 1 | 1 | 1 |
| Binary code (2-bit) | 0 | 0 | 1 | 1 |
|  | 0 | 1 | 0 | 1 |

FIG. 10

< 3-bit >

| Decimal number | 0 | 1 | 2 | 3 | 4 | 5 | 6 | 7 |
|---|---|---|---|---|---|---|---|---|
| Thermometer code | 0 | 0 | 0 | 0 | 0 | 0 | 0 | 1 |
|  | 0 | 0 | 0 | 0 | 0 | 0 | 1 | 1 |
|  | 0 | 0 | 0 | 0 | 0 | 1 | 1 | 1 |
|  | 0 | 0 | 0 | 0 | 1 | 1 | 1 | 1 |
|  | 0 | 0 | 0 | 1 | 1 | 1 | 1 | 1 |
|  | 0 | 0 | 1 | 1 | 1 | 1 | 1 | 1 |
|  | 0 | 1 | 1 | 1 | 1 | 1 | 1 | 1 |
| Binary code (3-bit) | 0 | 0 | 0 | 0 | 1 | 1 | 1 | 1 |
|  | 0 | 0 | 1 | 1 | 0 | 0 | 1 | 1 |
|  | 0 | 1 | 0 | 1 | 0 | 1 | 0 | 1 |

ANALOG-TO-DIGITAL CONVERSION (ADC) BASED ON CURRENT FLOW BETWEEN PAIRED PROBES AND ELECTRODES

CROSS-REFERENCE TO RELATED APPLICATIONS

This application claims the benefit under 35 U.S.C. § 119 (a) of Korean Patent Application No. 10-2007-0102012, filed on Oct. 10, 2007, in the Korean Intellectual Property Office, the entire disclosure of which is hereby incorporated by reference.

BACKGROUND OF THE INVENTION

1. Field of the Invention

The present invention relates to an analog-to-digital converter (ADC), and more particularly, to an ADC of a parallel type which converts analog signals to digital signals using Microelectromechanical Systems (MEMS) technology.

2. Description of the Related Art

Diverse signals in nature change to analog continuously over time. In order to understand such a phenomenon in nature, the size of the analog signals need to be measured over time. The values are processed and analyzed using a computer, but in order for the computer to process and analyze analog signals, a device for converting the analog signals into digital values which are able to be processed in the computer is required. Such a device is an analog-to-digital converter (ADC).

An ADC may be fabricated by Microelectromechanical Systems (MEMS) technology. MEMS technology may also be referred to as micro systems, micromachines, or micro mechatronics, and means developing mechanical devices with microscopic precision machinery technology. That is, an ADC may be miniaturized using MEMS technology.

Various types of ADC are available, including a parallel ADC, a single slope ADC, a dual slope integrating ADC, and a successive approximation ADC. The parallel ADC uses an operational amplifier (Op-Amp) as a comparator, and encodes a signal to be output into a binary shape to output the signal in a digital form. If input voltage is higher than reference voltage, the comparator outputs voltage corresponding to logical value 1.

The parallel ADC may comprise a plurality of resistors to set reference voltage, a plurality of comparators to compare voltages with reference voltage, and an encoder to output digital signals.

If an ADC comprises a plurality of resistors and comparators, the resistors and comparators would consume a great amount of power. But since more resistors and comparators are required to implement high resolution and high speed, far more power is consumed. Specifically, to implement an N-bit ADC, $2^N$ resistors and $2^N-1$ comparators are required. As the ADC of the higher bits is implemented, the power consumption increases exponentially.

As an ADC consuming less power is preferred, what is needed is an ADC for achieving high resolution and high speed with lower power consumption.

SUMMARY OF THE INVENTION

Exemplary embodiments of the present invention address at least the above problems and/or disadvantages and provide at least the advantages described below. Accordingly, an exemplary aspect of the present invention is to provide an analog-to-digital converter (ADC) for determining a digital output value according to whether electric current flows between probes and electrodes in order to achieve high resolution and high speed operation, but consuming lower power.

The foregoing and other objects and advantages are substantially realized by providing an analog-to-digital converter (ADC) comprising a plurality of probes to which an input voltage is applied; a plurality of electrodes; and a digital signal generator for determining a digital output value according to whether an electric current flows between the probes and the electrodes.

The probes may be disposed on one side of a conductive plate.

The digital signal generator may determine a thermometer code value of an electrode through which an electric current flows to be 1, and a thermometer code value of an electrode through which an electric current does not flow to be 0.

An N-bit ADC may require $2^N-1$ probes.

An N-bit ADC may require $2^N-1$ electrodes.

The probes may have different lengths. Whether an electric current flows between the probes and the electrodes may be determined according to a distance between an edge of the probe and the electrode and according to the magnitude of the input voltage.

The probes may become longer from the higher bit to the lower bit.

The ADC may further comprise a substrate comprising grooves formed on one side thereof to receive the electrodes.

The grooves of the substrate may have different depths. Whether an electric current flows between the probes and the electrodes may be determined according to the depth of the grooves and the magnitude of the input voltage.

The depth of the grooves may decrease from the higher bit to the lower bit.

The electrodes may have different heights. Whether an electric current flows between the probes and the electrodes may be determined according to the height of the electrodes and the magnitude of the input voltage.

The height of the electrodes may increase from the higher bit to the lower bit.

The ADC may further comprise a plurality of dielectrics disposed between the probes and the electrodes.

The dielectrics may have various types. Whether an electric current flows between the probes and the electrodes may be determined according to the type of dielectric and the magnitude of the input voltage.

Threshold voltages of the dielectrics having the same thickness may decrease from the higher bit to the lower bit.

The electric current may be a tunneling current for a tunneling effect occurring between the probes and the electrodes.

BRIEF DESCRIPTION OF THE DRAWINGS

The above aspects and features of the present invention will be more apparent by describing certain exemplary embodiments of the present invention with reference to the accompanying drawings, in which:

FIG. 2 is a table showing thermometer code output and binary code output of the 4-bit ADC of FIG. 1 according to a first exemplary embodiment of the present invention;

FIG. 10 is a table showing thermometer code output and binary code output of the 3-bit ADC of FIG. 9 according to the sixth exemplary embodiment of the present invention.

Throughout the drawings, the same drawing reference numerals will be understood to refer to the same elements, features and structures.

DETAILED DESCRIPTION OF EXEMPLARY EMBODIMENTS

Certain exemplary embodiments of the present invention will now be described in greater detail with reference to the accompanying drawings.

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
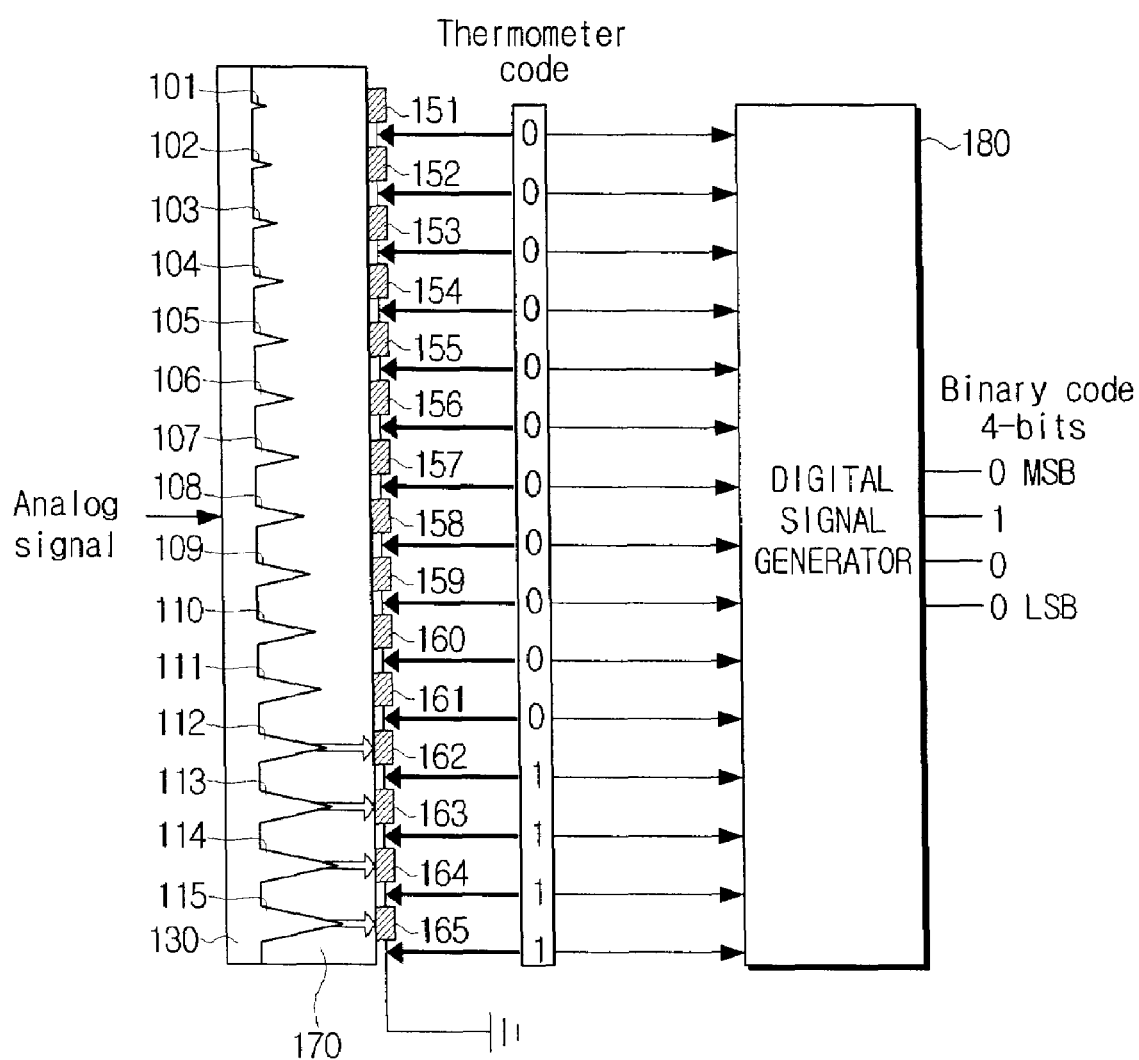
FIG. 1 is a diagram showing a configuration of a 4-bit analog-to-digital converter (ADC) comprising probes of different lengths according to a first exemplary embodiment of the present invention.

FIG. 1 is a diagram showing a configuration of a 4-bit analog-to-digital converter (ADC) comprising probes of different lengths according to a first exemplary embodiment of the present invention. A 4-bit binary code has 16 data forms in total, so if the 4-bit ADC is used, an analog signal may be divided into 16 levels and detected.

As shown in FIG. 1, the 4-bit ADC comprises 15 probes 101 to 115, a conductive plate 130, 15 electrodes 151 to 165, a medium 170 and a digital signal generator 180. Hereinafter, the uppermost located probe 101 to the lowermost located probe 115 are sequentially designated as a first probe 101 to a fifteenth probe 115, and the uppermost located electrode 151 to the lowermost located electrode 165 are sequentially designated as a first electrode 151 to a fifteenth electrode 165.

The probes 101 to 115 are disposed on one side of the conductive plate 130. A voltage type analog signal may be input to the probes 101 to 115. Additionally, whether a tunneling current flows or not may be determined according to a distance between the probes 101 to 115 and the electrodes 151 to 165, and according to the magnitude of the input voltage.

The probes 101 to 115 have different lengths, as the distance between the probes 101 to 115 and the electrodes 151 to 165 is adjusted to determine whether a tunneling effect occurs in each probe according to the magnitude of the input voltage.

The ADC of FIG. 1 is able to output a 4-bit signal, so the ADC may comprise a total of 15 probes. However, an N-bit ADC generally requires a total of $2^N-1$ probes.

The conductive plate 130 comprises the probes 101 to 115 disposed on one side thereof. If analog signals are input, the conductive plate 130 may transfer voltages to each of the probes 101 to 115.

In this exemplary embodiment of the present invention, the ADC may be implemented without having the conductive plate 130. If the conductive plate 130 is not included in the ADC, the probes 101 to 115 may be connected such that analog signals may be individually input to the probes 101 to 115.

The electrodes 151 to 165 are disposed in a row on one side of the medium 170. Since the probes 101 to 115 have different lengths, the electrodes 151 to 165 are spaced apart from the probes 101 to 115 at different intervals. Accordingly, the tunneling current may flow only through some of the electrodes.

The electrodes 151 to 165 are electrically connected to each other, and one end of each of the electrodes 151 to 165 is connected to a ground. In FIG. 1, the fifteenth electrode 165 is connected to a ground. As electric current flows toward an electrode connected to the ground, the tunneling current also flows toward the fifteenth electrode 165 at all times.

The medium 170 supports the probes 101 to 115, conductive plate 130 and electrodes 151 to 165. Additionally, as electric current should not be applied to the medium 170, the medium 170 needs to be an insulator.

Although the ADC of FIG. 1 comprises the medium 170, the ADC may be implemented without the medium 170.

The digital signal generator 180 receives thermometer code values according to whether the tunneling current flows through a conductive line, which connects the electrodes 151 to 165. The digital signal generator 180 determines thermometer code values of electrodes through which the tunneling current flows to be 1, and thermometer code values of electrodes through which the tunneling current does not flow to be 0. Accordingly, the digital signal generator 180 includes a galvanometer (not shown) to determine whether electric current flows or not.

The digital signal generator 180 converts thermometer code output into binary code output. The binary code value output from the digital signal generator 180 may be a digital output value. Accordingly, the digital signal generator 180 includes an encoder (not shown) to convert thermometer code output into binary code output.

Hereinafter, a process of outputting a 4-bit binary code and output values of the process will be described with reference to FIGS. 1 and 2. FIG. 2 is a table showing thermometer code output and binary code output of the 4-bit ADC of FIG. 1 according to the first exemplary embodiment of the present invention.

A voltage type analog signal (hereinafter, referred to as an input voltage) is input to the conductive plate 130. The input voltage is transferred to the probes 101 to 115 via the conductive plate 130. Here, since the electrodes 151 to 165 are connected to the ground, the voltage of the electrodes is 0V. Accordingly, a voltage equal to the input voltage may be applied between the probes 101 to 115 and the electrodes 151 to 165.

The tunneling effect may occur between probes and electrodes according to the magnitude of voltage applied therebetween and the distance therebetween. In other words, if a voltage equal to or greater than a predetermined value (hereinafter, referred to as "threshold voltage") is applied according to the distance between probes and electrodes, the tunneling effect may arise. The closer together the probes and the electrodes are located, the more frequently this tunneling effect can occur. Accordingly, if the input voltage is gradually increased, the tunneling current may flow from the lowest electrode, namely, the fifteenth electrode 165, to the higher electrodes in sequence. The tunneling effect will be described later in detail with reference to FIG. 3.

Since the same input voltage is applied between the probes 101 to 115 and the electrodes 151 to 165, the number of electrodes through which the tunneling current flows may be determined only according to the distance between the probes 101 to 115 and the electrodes 151 to 165. Therefore, the number of electrodes through which the tunneling current flows may be determined according to the magnitude of the input voltage.

The digital signal generator 180 determines, with respect to each electrode, whether the tunneling current flows or not. The digital signal generator 180 then sets thermometer code values of electrodes through which the tunneling current flows to be 1, and thermometer code values of electrodes through which the tunneling current does not flow to be 0.

The thermometer code output represents values, which are converted to 1's sequentially from the least significant bit (LSB) to the most significant bit (MSB) in the same manner as a thermometer. For example, 000000000000001 represents "1" in decimal notation, and 000000000000011 represents "2" in decimal notation. The thermometer code output may be represented by changing to 1's sequentially from the LSB to the MSB, so thermometer code output having M digits have M+1 forms. For example, referring to the table of FIG. 2, thermometer code output of 15 digits may be represented as 16 forms indicated by the numerals "0" to "15" in decimal notation.

The digital signal generator 180 then converts the thermometer code output into binary code output. In this situation, an encoder is generally used to convert the thermometer code output into binary code output.

Therefore, the input analog signal may be converted into binary code output, namely a digital signal.

FIG. 1 shows a situation in which the tunneling current flows through the twelfth electrode 162, thirteenth electrode 163, fourteenth electrode 164 and fifteenth electrode 165 when an analog signal of a predetermined size is input. Accordingly, the digital signal generator 180 may determine thermometer code output of the electrodes to be 000000000001111. The digital signal generator 180 may then convert the thermometer code output into binary code output, so that the code output may be 0100. In other words, a digital output value may be 0100, which corresponds to "4" in decimal notation in the table of FIG. 2. Therefore, when the range of the input analog signal is divided into 16 levels, that is, from Level 0 to Level 15, the voltage corresponding to Level 4 may be input as an analog signal.

The number of electrodes through which the tunneling current flows is determined according to the magnitude of the input voltage, so it is possible to convert the analog signal into a digital signal.

Figure 3:
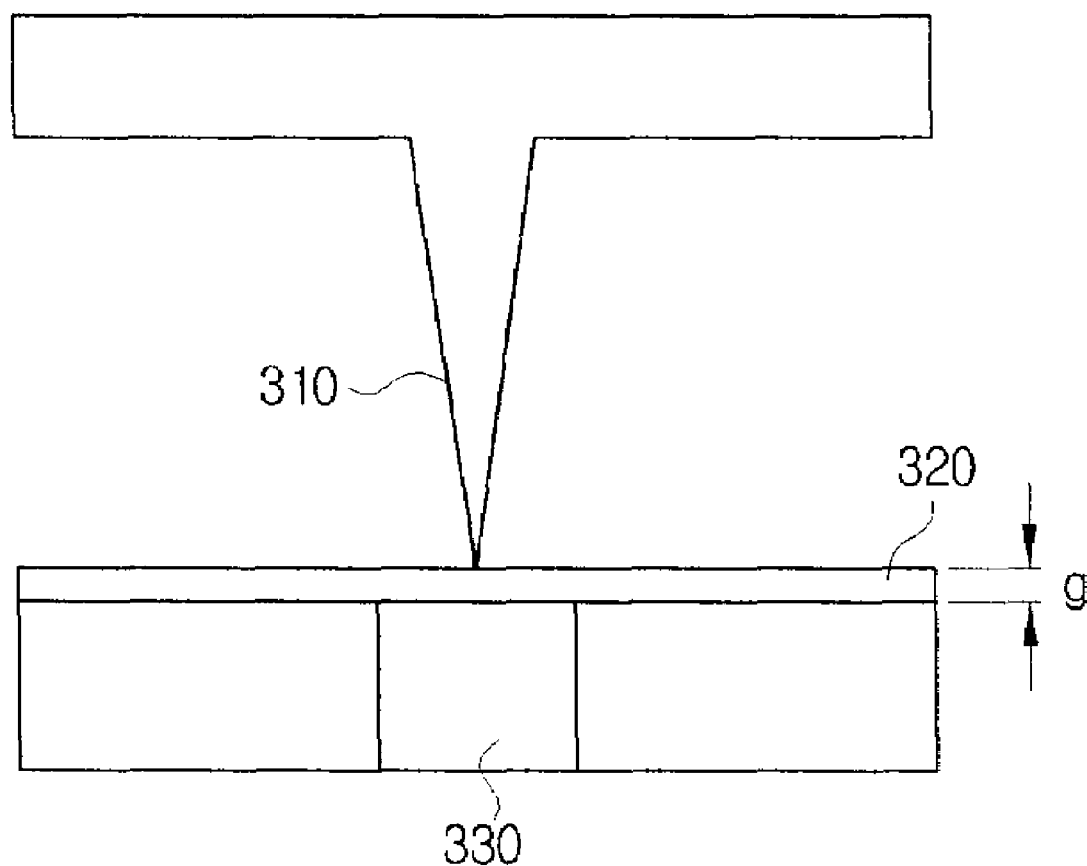
FIG. 3 is a diagram showing a configuration of a probe and an electrode to which the present invention is applicable.

Hereinafter, a tunneling effect occurring between a probe 310 and an electrode 330 will be described in detail with reference to FIG. 3. FIG. 3 is a diagram showing a configuration of the probe 310 and the electrode 330 to which the present invention is applicable.

As shown in FIG. 3, a dielectric 320 having a thickness of g is disposed between the probe 310 and the electrode 330. Accordingly, as the probe 310 and the electrode 330 are not connected, electric current does not flow therebetween.

Alternatively, if a voltage which equals or exceeds the threshold voltage is applied between the probe 310 and the electrode 330, electric current may flow therebetween. This effect is referred to as a tunneling effect, and the electric current flowing in this situation is called a tunneling current.

The tunneling effect means that electrons move between two points even when a potential barrier is disposed between the two points (that is, an insulator is placed between the two points). This tunneling effect may occur more frequently when the higher voltage is applied between the two points or when the distance between the two points becomes smaller. Additionally, the tunneling effect may arise according to the type of dielectric disposed between the two points. The threshold voltage for the tunneling effect is proportional to the distance between the two points.

The threshold voltage for the tunneling current is proportional to the distance g between the probe 310 and the electrode 330.

Accordingly, each threshold voltage of the electrodes 151 to 165 may be adjusted according to the different lengths of the probes 101 to 115 according to the first exemplary embodiment of the present invention. Additionally, each threshold voltage applied between the probes and the electrodes may be regulated using various methods other than the above method of the first exemplary embodiment of the present invention.

Hereinafter, a process of regulating the threshold voltage using various methods differing from the above method of the first exemplary embodiment of the present invention will be described with reference to FIGS. 4 to 6.

A second exemplary embodiment of the present invention in which the threshold voltage may be regulated according to the type of dielectric will be described with reference to FIG. 4. FIG. 4 is a diagram showing a configuration of a 4-bit ADC comprising dielectrics having different permittivity according to the second exemplary embodiment of the present invention.

Figure 4:
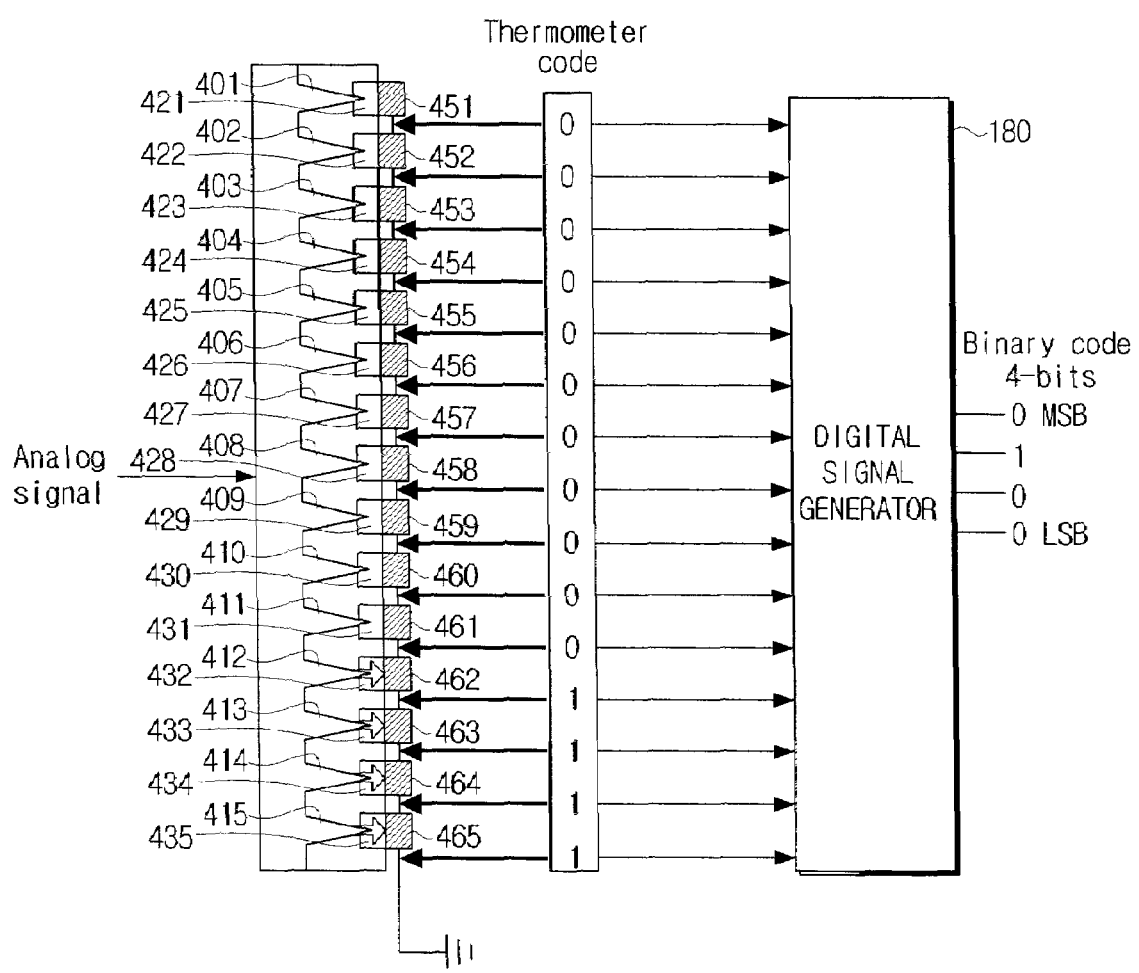
FIG. 4 is a diagram showing a configuration of a 4-bit ADC comprising dielectrics having different permittivity according to a second exemplary embodiment of the present invention.

In FIG. 4, the ADC comprises probes 401 to 415, dielectrics 421 to 435 and electrodes 451 to 465. The ADC of FIG. 4 is similar to the ADC of FIG. 1, and thus overlapping description will be omitted for the sake of brevity. The probes 401 to 415 of the ADC of FIG. 4 have the same length, and the dielectrics 421 to 435 are disposed between the probes 401 to 415 and the electrodes 451 to 465, so the ADC of FIG. 4 differs from the ADC of FIG. 1.

The probe and electrode of a lower bit may have a lower threshold voltage for the tunneling current, and the probe and electrode of a higher bit may have a higher threshold voltage for the tunneling current.

The level of tunneling effect may be determined according to the type of dielectrics disposed between the probes and electrodes. For example, air has a threshold voltage of approximately 0.8 mV/nm with respect to the tunneling effect. This means that a threshold voltage becomes approximately 0.8 mV when a distance between the probes and the electrodes is approximately 1 nm. Additionally, threshold voltages of rubber, glass, silica ($SiO_2$), polymethylmethacrylate (PMMA), polyethylene, quartz and nylon are approximately 17.7 mV/nm, 78.7 mV/nm, 500 mV/nm, 200 mV/nm, 100 mV/nm, 8 mV/nm and 14 mV/nm, respectively. Threshold voltages of other materials may also be measured using a test.

Various dielectrics are thus disposed between the probes and the electrodes even when there is no change in the distance between the probes and the electrodes, and so the threshold voltage may be adjusted.

The fifteenth dielectric 435 disposed between the fifteenth probe 415 and the fifteenth electrode 465 has the lowest threshold voltage. Additionally, the threshold voltages of the dielectrics 421 to 435 increase from the lower bit to the higher bit, and the first dielectric 421 disposed between the first probe 401 and the first electrode 451 thus has the highest threshold voltage.

As described above, the number of electrodes through which the tunneling current flows may increase as the input voltage of the analog signal increases due to the various dielectrics. Accordingly, the electrodes 451 to 465 may output various thermometer codes according to the magnitude of the analog signal.

The number of electrodes through which the tunneling current flows is controlled using the dielectrics having different permittivity, so it is possible to convert the analog signal into a digital signal.

A third exemplary embodiment of the present invention in which threshold voltages of each probe 501 to 515 and each respective electrode 551 to 565 may be regulated according to the height of the electrodes will be described with reference to FIG. 5. FIG. 5 is a diagram showing a configuration of a 4-bit ADC comprising electrodes having different heights according to the third exemplary embodiment of the present invention.

Figure 5:
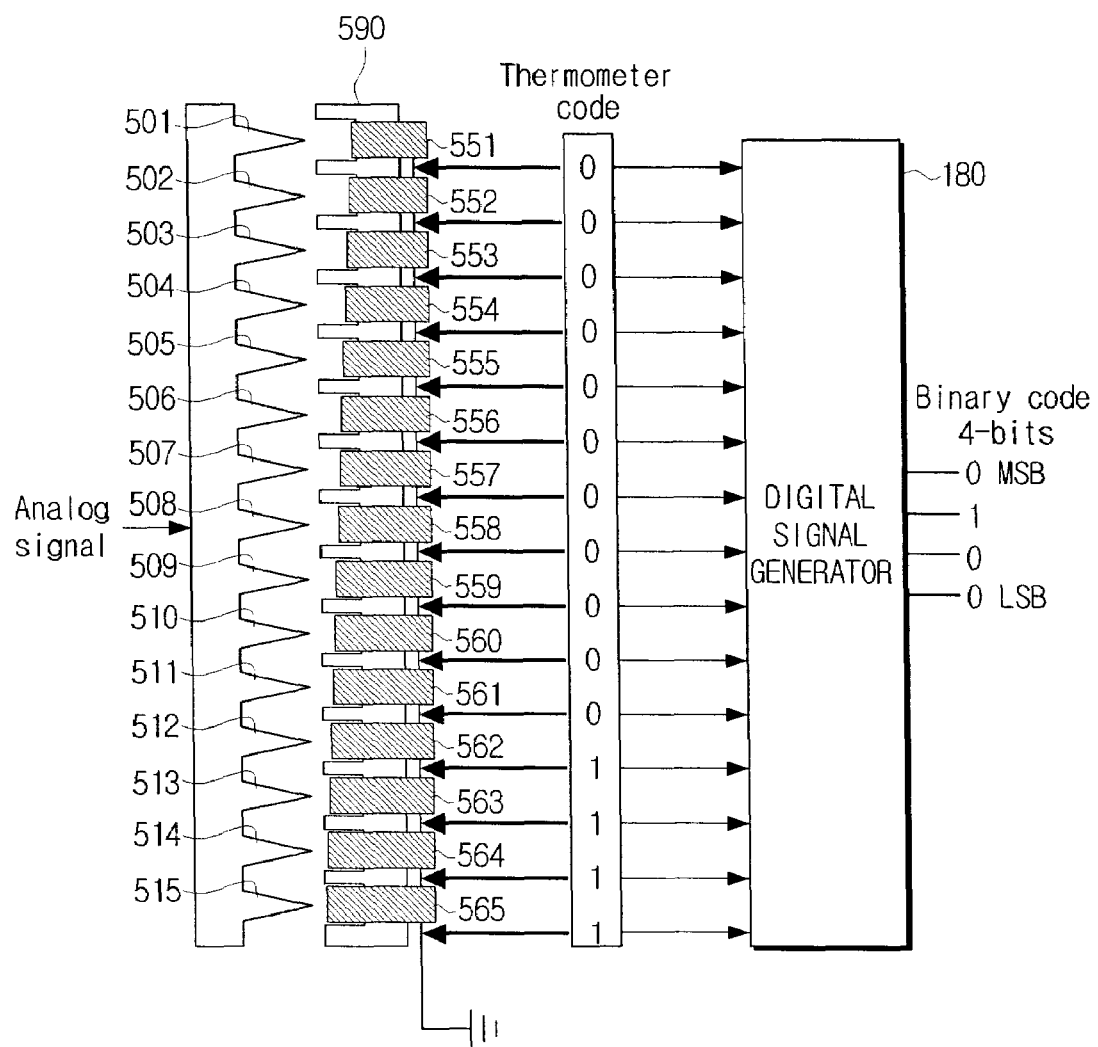
FIG. 5 is a diagram showing a configuration of a 4-bit ADC comprising electrodes having different heights according to a third exemplary embodiment of the present invention.

In FIG. 5, the ADC comprises probes 501 to 515 and electrodes 551 to 565. The ADC of FIG. 5 is similar to the ADC of FIG. 1, and thus overlapping description will be omitted for the sake of brevity. The probes 501 to 515 of the ADC of FIG. 5 have the same length, and the ADC of FIG. 5 further comprises a substrate 590 in which grooves are formed to receive the electrodes 551 to 565, so the ADC of FIG. 5 differs from the ADC of FIG. 1.

The probe and electrode of a lower bit may have a lower threshold voltage for the tunneling current, and the probe and electrode of a higher bit may have a higher threshold voltage for the tunneling current. Accordingly, the fifteenth electrode 565 needs to have the greatest height, because the greater the height of the electrodes, the closer together the probes and the electrodes are located. The height of the electrodes decreases from the lower bit to the higher bit, so the first electrode 551 has the lowest height. The distance between the probes and electrodes is thus regulated to adjust the threshold voltage.

As described above, as the input voltage of analog signals increases, the number of electrodes through which the tunneling current flows may be increased. Therefore, the electrodes 551 to 565 may output thermometer codes according to the magnitude of the analog signal.

The number of electrodes through which the tunneling current flows is controlled according to the height of the electrodes, so it is possible to convert the analog signal into the digital signal.

Hereinafter, a fourth exemplary embodiment of the present invention threshold voltages of each probe 601 to 615 and each respective electrode 651 to 665 may be regulated according to the depth of the grooves formed on a substrate 690 will be described with reference to FIG. 6. FIG. 6 is a diagram showing a configuration of a 4-bit ADC in which grooves having different depths are formed on the substrate 690 according to the fourth exemplary embodiment of the present invention.

Figure 6:
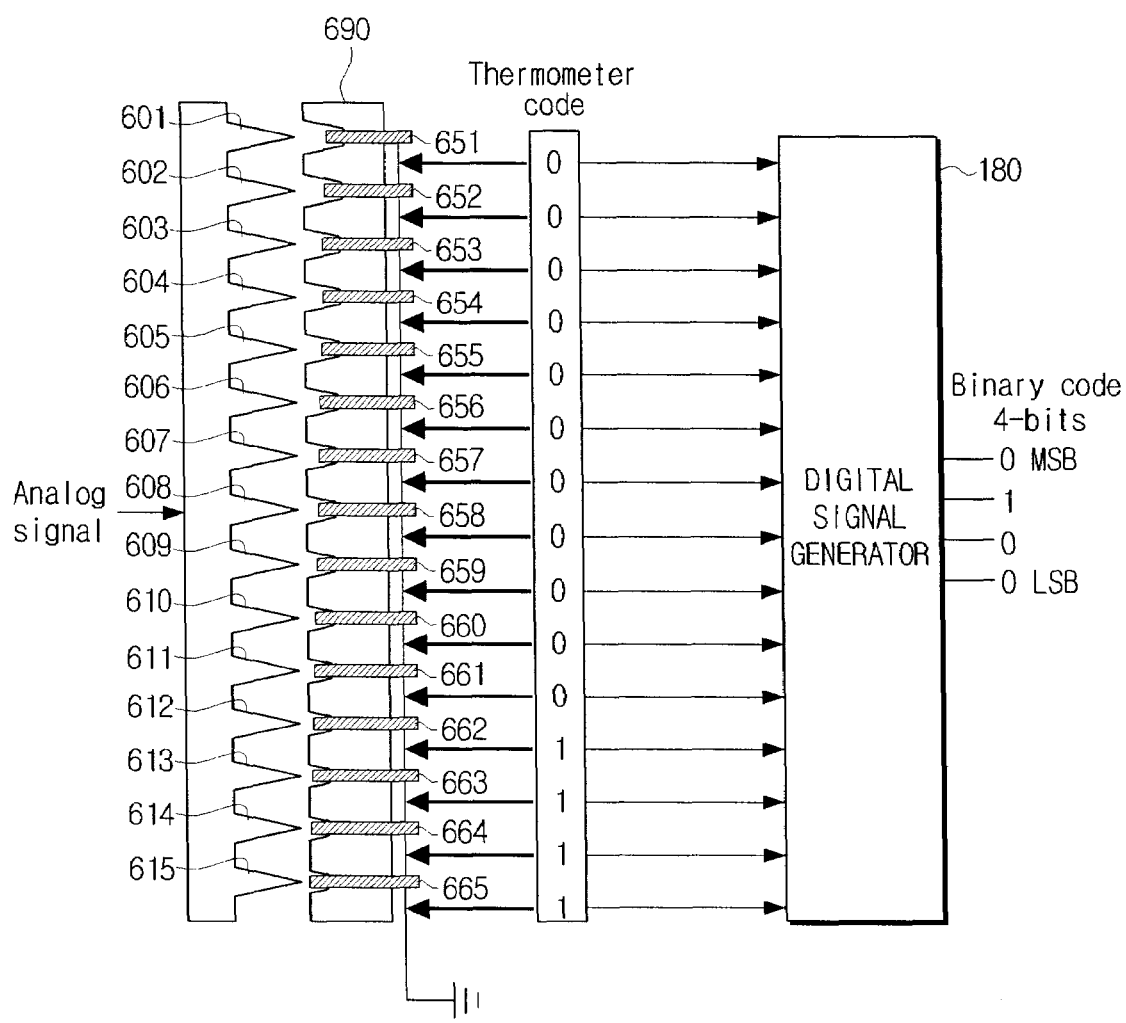
FIG. 6 is a diagram showing a configuration of a 4-bit ADC in which grooves having different depths are formed on a substrate according to a fourth exemplary embodiment of the present invention.

The ADC of FIG. 6 comprises probes 601 to 615 and electrodes 651 to 665. The ADC of FIG. 6 is similar to the ADC of FIG. 1, and thus overlapping description will be omitted for the sake of brevity. The probes 601 to 615 of the ADC of FIG. 6 have the same length, and the ADC of FIG. 6 further comprises the substrate 690 in which grooves are formed to receive the electrodes 651 to 665, so the ADC of FIG. 6 differs from the ADC of FIG. 1.

The probe and electrode of a lower bit may have a lower threshold voltage for the tunneling current, and the probe and electrode of a higher bit may have a higher threshold voltage for the tunneling current. Accordingly, the groove into which the fifteenth electrode 665 is inserted needs to have the lowest depth, because the lower the depth of groove, the closer together the probes and the electrodes are located. The depth of the grooves increases from the lower bit to the higher bit, so the groove into which the first electrode 651 is inserted has the greatest depth. The distance between the probes and electrodes is thus regulated to adjust the threshold voltage.

As described above, as the input voltage of analog signal increases, the number of electrodes through which the tunneling current flows may be increased. Therefore, the electrodes 651 to 665 may output thermometer codes according to the magnitude of the analog signal.

The number of electrodes through which the tunneling current flows is controlled according to the depth of the grooves, so it is possible to convert the analog signal into the digital signal.

The various processes for controlling the threshold voltage have been described with reference to FIGS. 4 to 6, however these are merely exemplary embodiments of the present invention. The present invention is applicable to any process for controlling the threshold voltage between probes and electrodes and determining whether the tunneling current flows or not.

Additionally, although only the 4-bit ADC is used in the exemplary embodiments of the present invention, an ADC to output other bits of digital values may also be implemented. For example, an N-bit ADC generally requires $2^N-1$ probes and $2^N-1$ electrodes. Hereinafter, a 2-bit ADC and a 3-bit ADC will be described with reference to FIGS. 7 to 10.

Figures 7, 8:
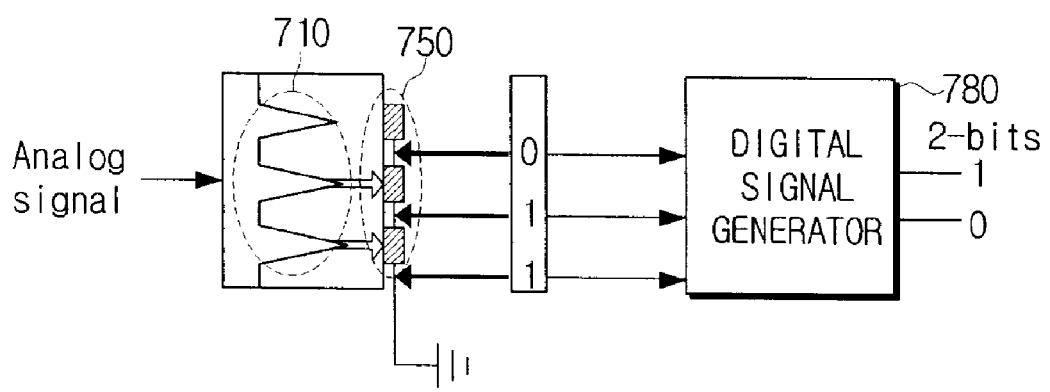
FIG. 7 is a diagram showing a configuration of a 2-bit ADC according to a fifth exemplary embodiment of the present invention.
FIG. 8 is a table showing thermometer code output and binary code output of the 2-bit ADC of FIG. 7 according to the fifth exemplary embodiment of the present invention.

FIG. 7 is a diagram showing a configuration of a 2-bit ADC according to a fifth exemplary embodiment of the present invention, and FIG. 8 is a table showing thermometer code output and binary code output of the 2-bit ADC of FIG. 7 according to the fifth exemplary embodiment of the present invention.

The 2-bit ADC of FIG. 7 comprises three probes 710, three electrodes 750 and a digital signal generator 780.

As shown in the table of FIG. 8, thermometer code output is represented as four forms indicated by the numerals "0" to "3" in decimal notation. Accordingly, 2-bit digital output values may be acquired.

For example, the 2-bit ADC of FIG. 7 outputs a thermometer code of "011", so the digital signal generator 780 may output a binary code of "10" as shown in the table of FIG. 8.

The 2-bit ADC may thus be implemented using the three probes and three electrodes.

Figure 9:
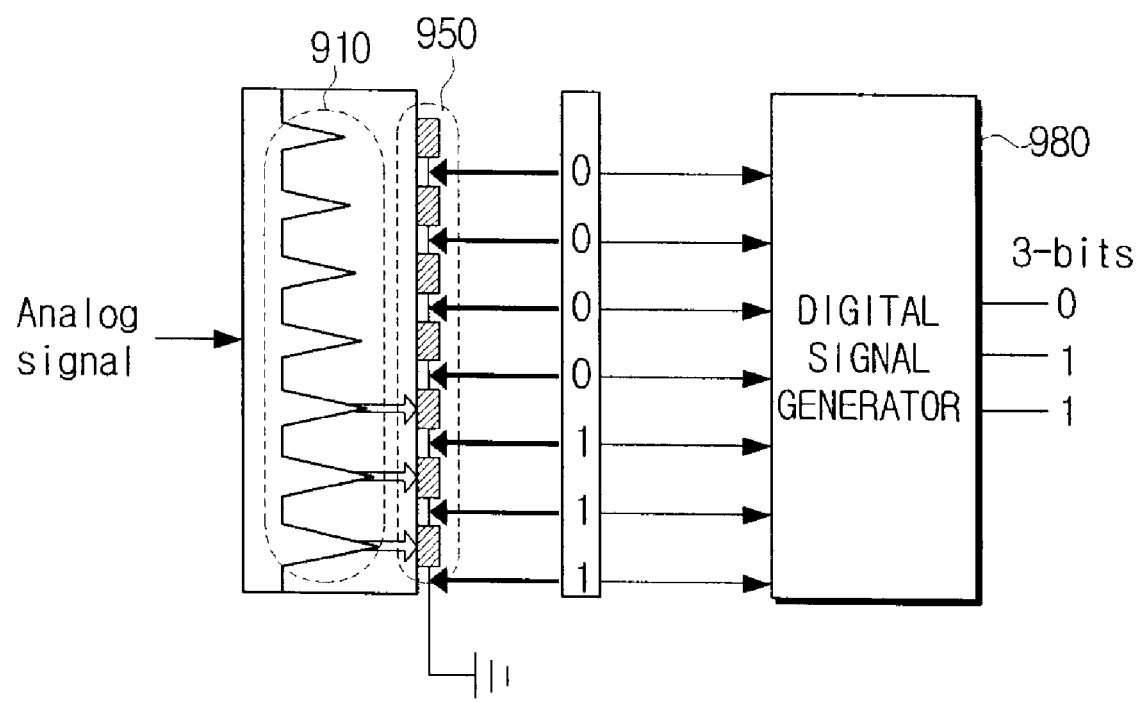
FIG. 9 is a diagram showing a configuration of a 3-bit ADC according to a sixth exemplary embodiment of the present invention.

FIGS. 9 and 10 show a 3-bit ADC. FIG. 9 is a diagram showing a configuration of the 3-bit ADC according to a sixth exemplary embodiment of the present invention, and FIG. 10 is a table showing thermometer code output and binary code output of the 3-bit ADC of FIG. 9 according to the sixth exemplary embodiment of the present invention.

The 3-bit ADC of FIG. 9 comprises seven probes 910, seven electrodes 950 and a digital signal generator 980.

As shown in the table of FIG. 10, thermometer code output is represented as eight forms indicated by the numerals "0" to "7" in decimal notation. Accordingly, 3-bit digital output values may be acquired.

For example, the 3-bit ADC of FIG. 9 outputs a thermometer code of "0000111", so the digital signal generator 980 may output a binary code of "011" as shown in the table of FIG. 10.

Therefore, the 3-bit ADC may be implemented using the seven probes and seven electrodes.

As described above, the exemplary embodiments of the present invention provide an ADC for determining a digital output value according to whether electric current flows between probes and electrodes, and thus high resolution and high speed operation is possible, but with lower power consumption.

Additionally, an N-bit ADC may be implemented using an MEMS type probe without the use of a resistor and a comparator, so it is possible to achieve high resolution with lower power consumption.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An analog-to-digital converter (ADC), comprising:
a plurality of probes to which an input voltage is applied;
a plurality of electrodes; and
a digital signal generator for determining a digital output value according to whether an electric current flows between the probes and the electrodes,
wherein the probes are disposed on one side of a conductive plate.

2. The ADC of claim 1, wherein the digital signal generator determines a thermometer code value of an electrode to be 1 if an electric current flows through the electrode, and determines the thermometer code value of the electrode not flow to be 0 if no electric current flows through the electrode.

3. The ADC of claim 1, wherein the ADC is an N-bit ADC that includes $2^N-1$ number of probes, N being an integer greater than 1.

4. The ADC of claim 1, wherein the ADC is an N-bit ADC that includes $2^N-1$ number of electrodes, N being an integer greater than 1.

5. The ADC of claim 1, wherein the electric current is a tunneling current for a tunneling effect occurring between the probes and the electrodes.

6. An analog-to-digital converter (ADC), comprising:
a plurality of probes to which an input voltage is applied;
a plurality of electrodes; and
a digital signal generator for determining a digital output value according to whether an electric current flows between the probes and the electrodes,
wherein the probes have different lengths, and
whether an electric current flows between the probes and the electrodes is determined according to a distance between an edge of the probe and the electrode and according to a magnitude of the input voltage.

7. The ADC of claim 6, wherein the probes become longer from the higher bit to the lower bit.

8. The ADC of claim 6, wherein the electric current is a tunneling current for a tunneling effect occurring between the probes and the electrodes.

9. The ADC of claim 6, wherein the ADC is an N-bit ADC that includes $2^N-1$ number of probes and $2^N-1$ number of electrodes, N being an integer greater than 1.

10. An analog-to-digital converter (ADC). comprising:
a plurality of probes to which an input voltage is applied;
a plurality of electrodes;
a digital signal generator for determining a digital output value according to whether an electric current flows between the probes and the electrodes; and
a substrate comprising grooves formed on one side thereof to receive the electrodes.

11. The ADC of claim 10, wherein the grooves of the substrate have different depths, and
whether an electric current flows between the probes and the electrodes is determined according to the depth of the grooves and the magnitude of the input voltage.

12. The ADC of claim 11, wherein the depth of the grooves decreases from the higher bit to the lower bit.

13. The ADC of claim 10, wherein the electric current is a tunneling current for a tunneling effect occurring between the probes and the electrodes.

14. The ADC of claim 10, wherein the ADC is an N-bit ADC that includes $2^N-1$ number of probes and $2^N-1$ number of electrodes, N being an integer greater than 1.

15. An analog-to-digital converter (ADC), comprising:
a plurality of probes to which an input voltage is applied;
a plurality of electrodes; and
a digital signal generator for determining a digital output value according to whether an electric current flows between the probes and the electrodes,
wherein the electrodes have different heights, and
whether an electric current flows between the probes and the electrodes is determined according to the height of the electrodes and the magnitude of the input voltage.

16. The ADC of claim 15, wherein the height of the electrodes increases from the higher bit to the lower bit.

17. The ADC of claim 15, wherein the electric current is a tunneling current for a tunneling effect occurring between the probes and the electrodes.

18. The ADC of claim 15, wherein the ADC is an N-bit ADC that includes $2^N-1$ number of probes and $2^N-1$ number of electrodes, N being an integer greater than 1.

19. An analog-to-digital converter (ADC), comprising:
a plurality of probes to which an input voltage is applied;
a plurality of electrodes;
a digital signal venerator for determining a digital output value according to whether an electric current flows between the probes and the electrodes; and
a plurality of dielectrics disposed between the probes and the electrodes.

20. The ADC of claim 19, wherein the dielectrics have various types, and
whether an electric current flows between the probes and the electrodes is determined according to the type of dielectric and the magnitude of the input voltage.

21. The ADC of claim 20, wherein threshold voltages of the dielectrics having the same thickness decrease from the higher bit to the lower bit.

22. The ADC of claim 19, wherein the electric current is a tunneling current for a tunneling effect occurring between the probes and the electrodes.

23. The ADC of claim 19, wherein the ADC is an N-bit ADC that includes $2^N-1$ number of probes and $2^N-1$ number of electrodes, N being an integer greater than 1.

24. An analog-to-digital converter (ADC), comprising:
a plurality of probes to which an input voltage is applied;
a plurality of electrodes each in a paired arrangement with a respective associated one of the plurality of probes so as to form a plurality of pairs of probe and electrode, a first one of the plurality of electrodes being spaced apart from its associated paired one of the plurality of probes by a first distance different from a second distance by which a second one of the plurality of electrodes being spaced apart from its associated paired one of the plurality of probes;

a digital signal generator configured to determine a digital output value according to whether an electric current flows between one or more of the plurality of pairs of probe and electrode.

25. The ADC of claim 24, wherein each the plurality of probes has a respective length different from other ones of the plurality of probes such that respective distances between probe and electrode of the plurality of pairs of probe and electrode vary.

26. The ADC of claim 24, further comprising:

a substrate having a plurality of grooves each receiving therein one of the plurality of electrodes, each of plurality of grooves having a respective depth different from other ones of the plurality of grooves such that respective distances between probe and electrode of the plurality of pairs of probe and electrode vary.

27. The ADC of claim 24, wherein each of the plurality of electrodes has a respective height extending towards its associated one of the plurality of probes that is different from other ones of the plurality of electrodes such that respective distances between probe and electrode of the plurality of pairs of probe and electrode vary.

* * * * *